United States Patent
Mohri

[11] Patent Number: 5,152,433
[45] Date of Patent: Oct. 6, 1992

[54] APPARATUS FOR FEEDING GRANULAR SILICON MATERIAL

[75] Inventor: Yoshio Mohri, Kawasaki, Japan
[73] Assignee: NKK Corporation, Tokyo, Japan
[21] Appl. No.: 746,075
[22] Filed: Aug. 12, 1991

Related U.S. Application Data

[63] Continuation-in-part of Ser. No. 543,034, Jun. 22, 1990, abandoned.

[30] Foreign Application Priority Data

Jul. 5, 1989 [JP] Japan .................. 1-173676

[51] Int. Cl.⁵ .............................. B67D 1/08
[52] U.S. Cl. ...................... 222/152; 222/181; 222/183; 222/461; 222/509
[58] Field of Search ............ 222/152, 162, 181, 183, 222/185, 461, 504, 509

[56] References Cited

U.S. PATENT DOCUMENTS

| | | | |
|---|---|---|---|
| 909,654 | 1/1909 | Patterson | 288/183 |
| 2,354,197 | 7/1944 | Campbell | 228/162 |
| 3,123,107 | 3/1964 | Kappler | 222/181 X |
| 3,820,687 | 6/1974 | Brock | 222/152 X |
| 3,998,686 | 12/1976 | Meiling et al. | 222/56 X |
| 4,002,274 | 1/1966 | Rice | 222/410 |
| 4,299,338 | 11/1981 | Jain et al. | 222/461 X |
| 4,505,407 | 3/1985 | Johnson | 222/181 |
| 4,816,227 | 3/1989 | Homer et al. | 222/461 X |
| 4,863,065 | 9/1989 | Decrane | 222/185 X |
| 4,904,143 | 2/1990 | Drechsel et al. | 414/212 |

FOREIGN PATENT DOCUMENTS

0314858 5/1989 European Pat. Off.
61-17537 5/1986 Japan.

Primary Examiner—Andres Kashnikow
Assistant Examiner—Joseph A. Kaufman
Attorney, Agent, or Firm—Frishauf, Holtz, Goodman & Woodward

[57] ABSTRACT

An apparatus for feeding granular silicon material comprises a hopper for storing granular silicon material, a feeder for feeding granular silicon material stored in the hopper, a first guide tube for leading granular silicon material fed from the feeder, a feed tube for feeding granular silicon material, which is arranged in a lower portion of the first guide tube and movable upward and downward, a housing incorporating the hopper, the feeder, the guide tube and the feed tube, a sluice valve for closing an opening of a chamber of the apparatus for manufacturing silicon single crystals, and a second guide tube which is positioned in a portion of the opening of the chamber and which leads granular silicon material to a crucible for melting granular silicon material.

4 Claims, 3 Drawing Sheets

FIG. 1
FIG. 2
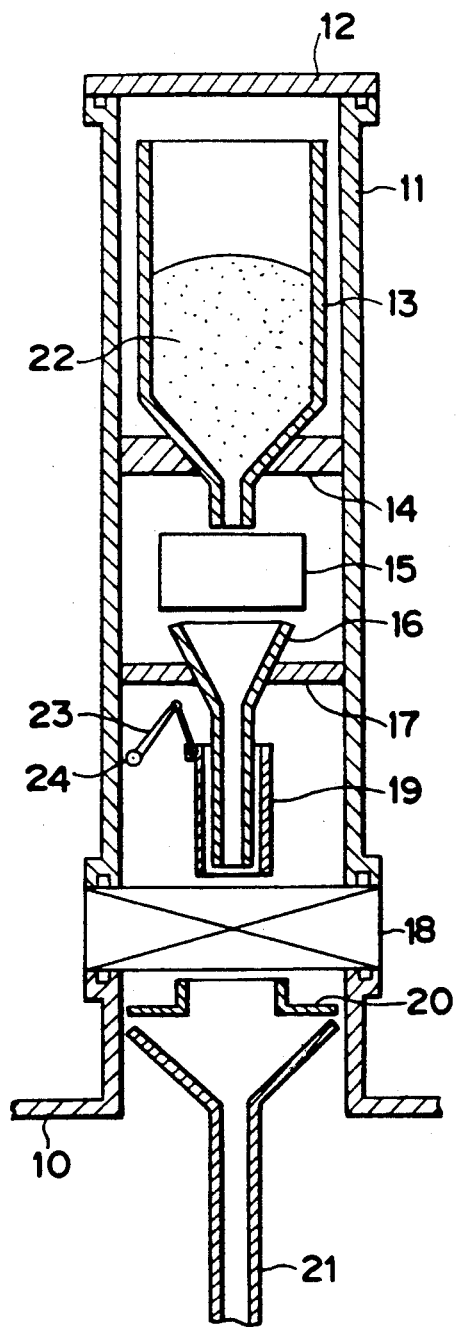
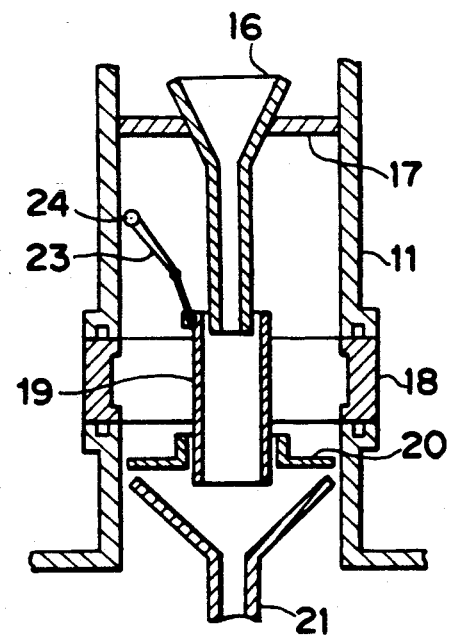

APPARATUS FOR FEEDING GRANULAR SILICON MATERIAL

This application is a continuation-in-part, of application Ser. No. 07/543,034, filed Jun. 22, 1990, now abandoned.

BACKGROUND OF THE INVENTION

1. Field of the Invention

The present invention relates to an apparatus for manufacturing a silicon single crystal by means of the "Czochralski pulling technique", and more particularly to a method for feeding granular silicon into a crucible.

2. Description of the Prior Art

An apparatus heretofore known for the manufacture of silicon single crystals by the Czochralski method includes an apparatus of the type which continuously pulls a silicon single crystal while feeding granular silicon into a crucible. The silicon single crystal is grown in an inert atmosphere under reduced pressure to avoid incorporation of impurities into the molten silicon. Accordingly, an apparatus for feeding granular silicon material comprises a material storage hopper, a feeder, a guide tube and a housing enclosing said hopper, said feeder and said guide tube. The granular silicon material is stored in the material storage hopper. A predetermined amount of said silicon material is discharged from a lower discharge port of the hopper and is fed by the feeder to the crucible through the guide tube. Japanese Examined Patent Publication No. 17537/86 discloses an example of the aforementioned.

In the "Czochralski pulling technique" wherein the granular silicon material is continuously fed into the crucible, when the granular silicon material in the hopper has been used up, the hopper is replenished with granular silicon material. When the granular silicon material is charged into the hopper, measures should be taken so that air cannot be introduced into a chamber of the apparatus for pulling a silicon single crystal. Accordingly, a sluice valve, which can cut off communication between the hopper and the chamber, and which is fit for vacuum sealing, is mounted on a position of the housing enclosing the material storage hopper. The granular silicon material is charged into the hopper after the sluice valve has been closed and the pressure inside the housing having the hopper therein has been elevated to atmospheric pressure.

However, when the sluice valve is mounted on one position of the housing, the guide tube leading the granular silicon to the crucible cannot be passed through the sluice valve. That is, the guide tube is divided into two portions before and behind the sluice valve. Accordingly, when the granular silicon is fed to the crucible, the granular silicon freely falls by its weight from the guide tube positioned before the sluice valve into the guide tube positioned behind the sluice valve. During the fall of the granular silicon, the granular silicon strikes the guide tube positioned behind the sluice valve, and either rebounds or scatters. When the granular silicon rebounds or scatters, particles of silicon attach to the surface of a seat of the sluice valve or accumulate thereon. In the case where particles of silicon are attached to the surface of the seat of the sluice valve, when fresh granular silicon is charged into the hopper, the particles of silicon are gripped between the seat and the disc of the sluice valve although the sluice valve is closed, lowering the capability of the sluice valve for vacuum sealing. In consequence, air is introduced into the chamber, and the successive growth of silicon single crystals cannot be carried out.

SUMMARY OF THE INVENTION

It is an object of the present invention to provide an apparatus for feeding granular silicon material, wherein silicon single crystals can be continuously manufactured for a long period of time.

To attain the aforementioned object, the present invention provides an apparatus for feeding granular silicon material comprising:

To attain the aforementioned object, the present invention provides an apparatus for feeding granular silicon material comprising a hopper for storing granular silicon material; a feeder for feeding granular silicon material stored in said hopper; a first guide tube arranged for receiving granular silicon material fed from said feeder, and for leading the received material to an outlet of said first guide tube; a feed tube for feeding granular silicon material, and which is arranged at a lower portion of said first guide tube, said feed tube being movable upwardly and downwardly between upper and lower positions, said feed tube surrounding said lower portion of first guide tube when in said upper position; a housing incorporating therein the hopper, the feeder, the first guide tube and the feed tube; a chamber mounted below said housing for receiving granular silicon material from said housing, and including means including a crucible for manufacturing silicon single crystals from said granular silicon material; a sluice valve for selectively closing an opening of said chamber; said feed tube being movable with a stroke between said upper and lower positions such that when it is in said upper position, a lower end of said feed tube is located above said sluice valve when said sluice valve is closed, and when said feed tube is located at said lower position, said lower end thereof is in a position passing through and below said sluice valve when said sluice valve is opened; and a second guide tube which is positioned in communication with at least a portion of said opening of said chamber and which is arranged to receive granular silicon material from said feed tube when said feed tube is in said lower position, said second guide tube leading granular silicon material to said crucible for melting the granular silicon material fed thereto.

The above objects and other objects and advantages of the present invention will become apparent from the detailed description which follows, taken in conjunction with the appended drawings.

BRIEF DESCRIPTION OF THE DRAWINGS

FIG. 1 is a vertical sectional view of the present invention illustrating an apparatus for feeding granular silicon material;

FIG. 2 is a schematic illustration showing state wherein a feed tube for feeding granular silicon material is inserted into an opening of a rebound-preventive plate arranged in a portion of an opening of a chamber.

DESCRIPTION OF THE PREFERRED EMBODIMENT

Figure 3:
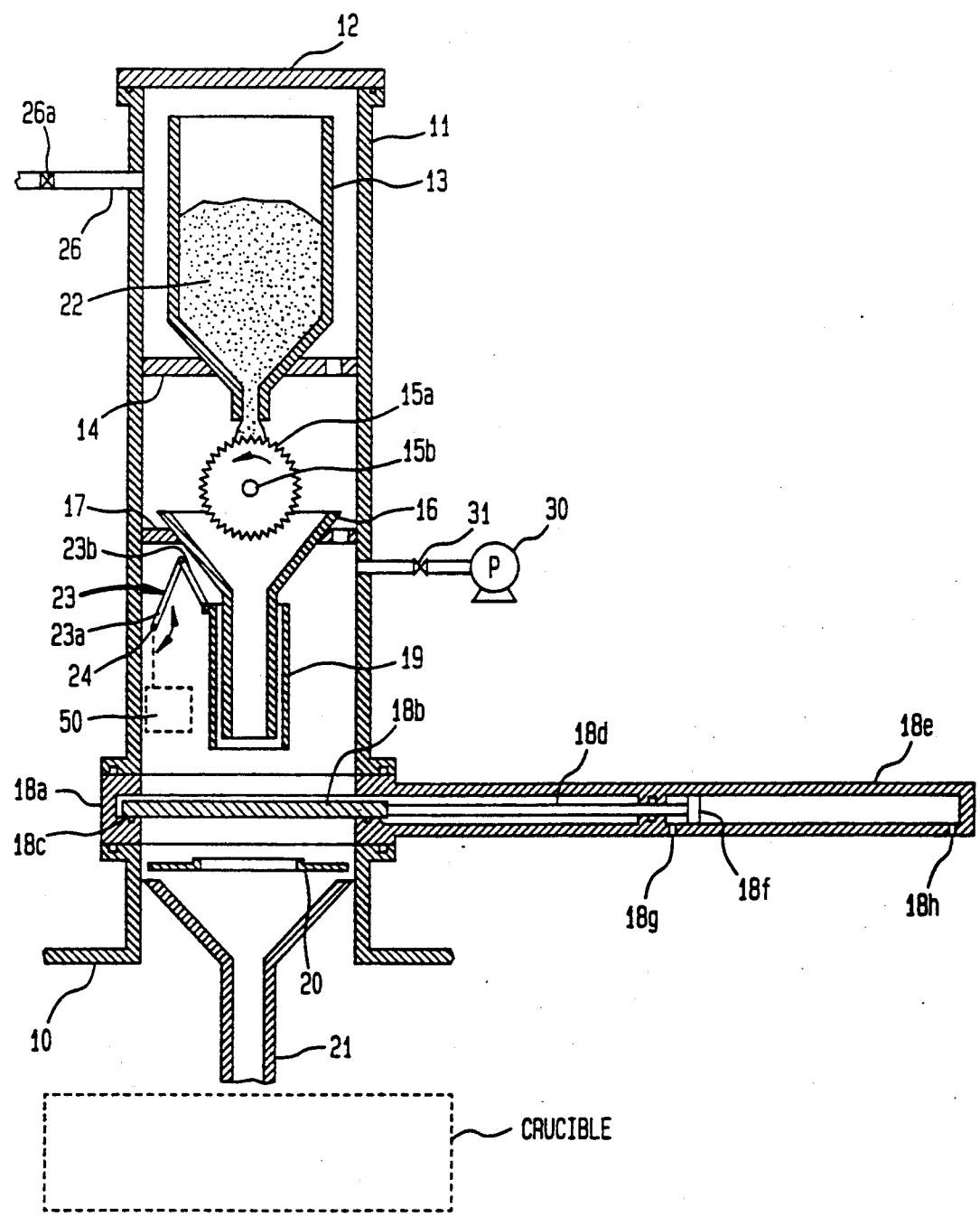
FIG. 3 is a vertical sectional view of the apparatus for feeding granular silicon material, showing the present invention in greater detail.

In the present invention, every time manufacturing of a silicon single crystal is to be performed; a sluice valve, fitted for vacuum sealing, and mounted on at least one portion of a housing incorporating a hopper for storing materials, is closed. The pressure inside the housing incorporating the hopper for storing granular silicon material is increased to atmospheric pressure. Subsequently, granular silicon material is charged into the hopper. When a silicon single crystal is manufactured, the sluice valve is opened, and a feed tube for feeding granular silicon material is lowered. The feed tube for feeding granular silicon material is then positioned to pass; through the sluice valve. A predetermined amount of silicon material discharged from the hopper can thus be fed by the feeder into a crucible through the feed tube for feeding granular silicon material.

FIG. 1 is a vertical sectional view illustrating the apparatus for feeding granular silicon material of the present invention. A housing 11 is arranged on an opening of the chamber 10 of the apparatus for manufacturing silicon single crystals, with the sluice valve 18 positioned between the housing 11 and the opening of the chamber. The inside of the housing 11 communicates with the inside of the chamber 10. The hopper 13 for storing silicon material and the feeder 15 for feeding silicon material are arranged inside the housing 11. The hopper 13 is held by a hopper bearer 14. A first guide tube 16 and a feed tube 19 for feeding granular silicon material are arranged on the upper side of the sluice valve 18. The first guide tube 16 is held by a guide tube bearer 17. A rebound-preventive plate 20 and a second guide tube 21 for leading granular silicon material 22 into the crucible are arranged in a portion of the opening of the chamber 10.

The operation of the apparatus will now be described.

Every time manufacturing of one silicon single crystal is to be performed, the feed tube 19 for feeding granular silicon material is lifted from the inside of the sluice valve 18 by means of a linkage 23 for lifting and lowering a feed tube. The sluice valve 18 positioned at the lower end of the housing 11 is closed. The pressure inside the housing 11 is elevated to atmospheric pressure, and a cover 12 of the housing 11 which is bolted onto the upper portion of the housing 11 is opened. The granular silicon material 22 as material for manufacturing silicon single crystals is fed into the hopper 13. When particles 22 of silicon attach to the seat of the sluice valve 18 during feeding of the granular silicon material 22, a vacuum holding capability of the sluice valve 18 becomes insufficient. When the vacuum-holding capability of the sluice valve is insufficient, air is introduced into the chamber 10 for manufacturing silicon single crystals, making the growth of silicon single crystals impossible.

When the next silicon single crystal is manufactured, after the granular silicon material 22 has been charged into the hopper 13, the cover 12 of the housing 11 is bolted onto the upper portion of the housing 11. Next, air inside the housing 11 is substituted for and inert atmosphere of reduced pressure, and the sluice valve 18 is opened.

After the sluice valve 18 has been opened, the feed tube 19 for feeding granular silicon material is lowered by means of the linkage 23 for lifting and lowering the feed tube, and is made to pass through the sluice valve 18. The lower end of the feed tube 19 for feeding granular silicon material is inserted into the opening of the rebound-preventive plate 20 arranged in a portion of the opening of the chamber 10. FIG. 2 is a schematic illustration showing the state wherein the feed tube 19 for feeding granular silicon material is inserted into the opening of the rebound-preventive plate arranged in a portion of the opening of the chamber 10. The linkage for lifting and lowering the feed tube has a predetermined stroke. When the sluice valve is closed, the lower end of the feed tube for feeding granular silicon material is located in a position above the sluice valve. When the sluice valve is opened, the lower end of the feed tube for feeding granular silicon material is located in a position below the sluice valve, passing through the sluice valve.

Figure 4:
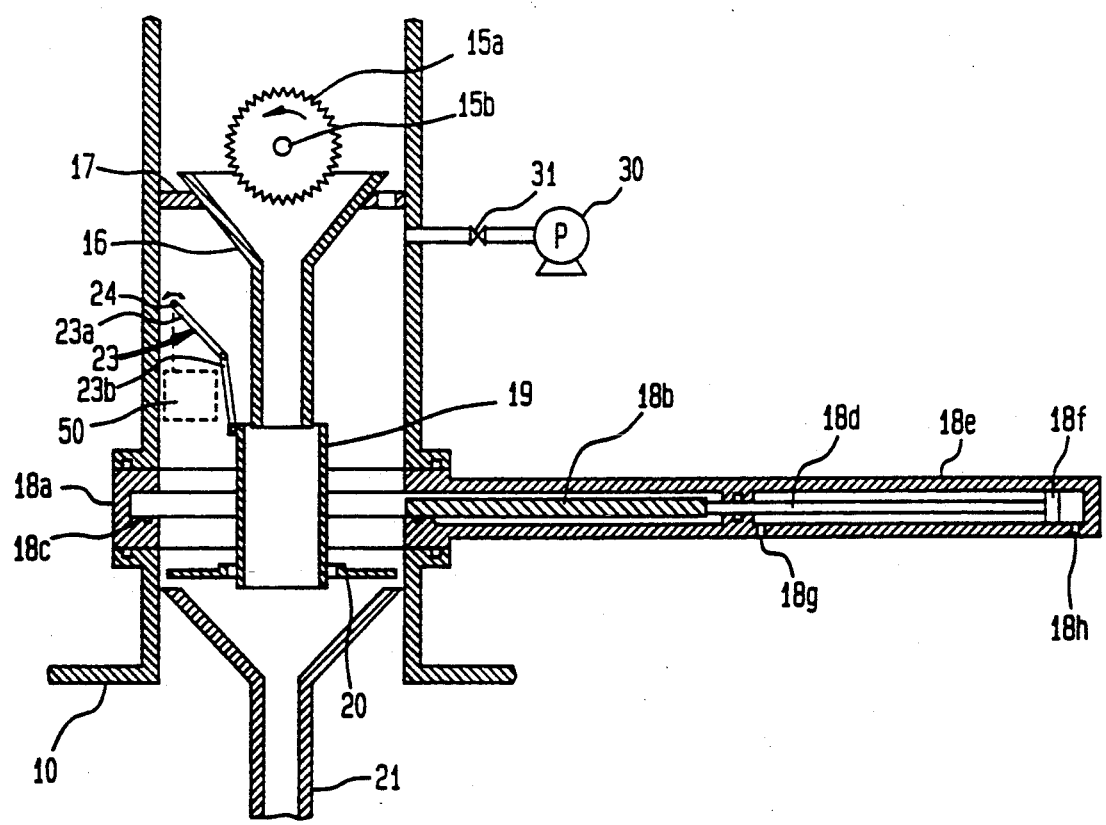
FIG. 4 is a partial view of the apparatus of FIG. 3, showing the sluice valve in its opened condition, with the feed tube lowered.

The operation of the apparatus of the present invention will be described below in more detail with respect to FIGS. 3 and 4 showing more details of the apparatus.

1. Operation of Feeder

FIG. 3 shows a vertical section of an apparatus for feeding granular silicon material of the present invention. The feeder for feeding granular silicon material comprises a rotary cylinder 15a having a horizontal rotating axis 15b. The rotary cylinder 15a has many projections or depressions on its outer surface so that the granular silicon material 22 tends not to roll down the outer surface of the rotary cylinder 15a. The granular silicon material 22 in hopper 13 for storing the granular silicon material is fed through an outlet at the bottom of the hopper 13 to the rotary cylinder 15a, and is fed by the projections or depressions without rolling down off of the outer surface of the cylinder 15a. The granular silicon material 22 is fed in succession by its own dead weight from the outer surface of cylinder 15a to first guide tube 16 mounted below cylinder 15a. Since the discharged amount of the granular silicon material at the feeder is determined by the traveling speed of the material on the outer surface of the rotary cylinder 15a, the discharged amount is controlled by the rotation speed of the rotary cylinder 15a. Any type of feeder will do so long as it is a continuous feeder which can feed at a constant amount of the material. A vibrating feeder can be used.

2. Opening and Closing of Sluice Valve

FIG. 3 shows a state of sluice valve 18 being closed. FIG. 4 shows a state of the sluice valve being opened. 18a denotes a valve case, 18b a valve disk, 18c a valve seat, 18d a rod, 18e an air cylinder, 18f a piston, and 18g and 18h denote an entrance and exit for driving air.

When the sluice valve 18 is to be opened, the driving air is introduced through entrance and exit 18g and piston 18f moves toward the right by pressure of the driving air. By the movement of the piston to the right, valve disk 18b connected to the piston 18f moves to the right by means of rod 18b. The sluice valve 18 is thus opened.

When the sluice valve 18 is to be closed, the driving air is introduced through entrance and exit 18h and the air on the left side of the piston 18f in air cylinder 18e is discharged through entrance and exit 18g, whereby piston 18f moves toward the left. By the movement of the piston to the left, valve body 18b connected to the piston moves to the left by means of rod 18b. The sluice valve 18 is thus closed.

3. Method of Feeding Silicon Material to Hopper (1) As shown in FIG. 3, rotary axis 24 is connected to a linkage 23 for lifting and lowering a silicon material feed tube 19. When the rotary axis is rotated counterclockwise by a rotating device (not shown), the feed tube 19 is elevated by the linkage 23 and is pulled up out of the sluice valve 18 so as to surround the outlet tube of the hopper 13.

(2) By means of introducing pressurized drive air for driving the sluice valve 18, through the entrance and exit 18h, the sluice valve 18 is closed.

(3) Inert gas is supplied through inert gas supply tube 26 into housing 11 (FIG. 3), and, the inside of the housing 11 is made to be at atmospheric pressure. If the sealing capability of sluice valve 18 is lowered at the time of the interior of the housing is made to be at atmospheric pressure, the inside chamber 10 fails to be kept at the inert gas atmosphere of reduced pressure.

(4) When the inside pressure of the housing 11 is at atmospheric pressure, cover 12 which is fastened with a bolt (not shown) is removed and silicon material 22 is fed into the hopper 13.

(5) After the silicon material 22 is fed into the hopper 13, the cover 12 is bolted or otherwise fixed to the housing 11.

(6) Vacuum pump 30 starts working and exhaust valve 31 is opened. The gas in the housing 11 is exhausted and the housing 11 is made to be under a vacuum. After the inside of the housing 11 is made to be in the state of a vacuum, the exhaust valve 31 is closed and the vacuum pump 30 stops operation.

(7) A small amount of inert gas is supplied into the housing 11 through the inert gas supply tube 26 by opening valve 26a. The inside atmosphere of the housing 11 becomes an inert gas atmosphere of reduced pressure having the same pressure as the inside pressure of the chamber 10. When the predetermined atmosphere is attained, the inert gas supply (via tube 26) to the housing 11 is stopped by closing valve 26a.

(8) When the inside pressure of the housing 11 becomes the same pressure as the inside pressure of the chamber 10 at the inert gas atmosphere of reduced pressure, pressurized air is introduced through the entrance and exit 18g of the air cylinder 18e and the sluice valve 18 is opened.

(9) Rotary axis 24 is rotated clockwise by the rotating device 50 (not shown in detail). This causes the silicon material feed tube 19 to move down (see FIG. 4) by means of linkage 23 connected to the rotary axis 24 and the feed tube 19 passes through the opening of the sluice valve 18. The lower end of the feed tube 19 is inserted through the opening of the rebound-prevention plate 20 mounted at an opening portion of the chamber 10 below the sluice valve 18.

(10) The rotating axis 15b for the feeder is rotated and the rotary cylinder 15a connected to the rotating axis 15b is rotated as shown by the arrow in FIG. 3. By this rotation of the rotary cylinder 15a, the granular silicon material 22 is fed through an outlet at the bottom of the hopper 13 to the rotary cylinder 15a. The granular silicon material 22 stays on the outer surface of the rotary cylinder 15a and moves by the rotation of the cylinder 15a, and then falls down by its dead weight and is fed into the first funnel-shaped guide tube 16 below the cylinder 15a.

(11) A predetermined amount of granular silicon material 22 which has been fed into the first guide tube 16, is fed, through the feed tube 19 and the second guide tube 21, into a crucible (schematically shown in FIG. 3) for melting.

4. Principle of Driving Linkage for Lifting and Lowering

By means of having the rotating axis 24 rotated clockwise or counterclockwise by a rotating device 50 (not shown in detail), arm 23a of the linkage 23, which is connected to rotary axis 24, is caused to be rotated clockwise or counterclockwise, respectively, and by means of the second arm 23b of the linkage 23, the feed tube 19 is elevated (FIG. 3) or lowered (FIG. 4). The arm 23b is pivotally connected at one end to arm 23a and at the other end to feed tube 19

A silicon single crystal is manufactured by supplying a predetermined amount of the granular silicon material, which corresponds to a pulling amount of the silicon single crystal from the hopper 13, into the crucible by the use of the feeder 15 for feeding silicon material. The predetermined amount of granular silicon material 22 fed by means of the feeder 15 falls from the feeder 15 into the second guide tube 21 through the first guide tube 16 by its own weight. When the granular silicon material 22 falls, some of the granular silicon material 22 strikes a cylindrical portion of the second guide tube 21 and rebounds. The rebounded silicon particles can be prevented from attaching to the seat of the sluice valve 18 by causing the feed tube 19 for feeding granular silicon material to pass through the sluice valve 18 as described above. Accordingly, the problem wherein the vacuum-holding capability of the sluice valve 18 is lowered by gripping or engaging of the silicon particles between the seat and the disk of the sluice valve can be solved.

Further, inclusion of impurities into the crucible can be prevented by using silica, silicon or teflon for the portion of the first guide tube 16, the second guide tube 21, the feed tube 19 for feeding granular silicon material, the rebound-preventive plate 20 and the like, which contact the silicon particles.

As described above, according to the apparatus for feeding granular silicon material of the present invention, granular silicon material can be recharged into the hopper for storing silicon material without introducing air into the chamber, when manufacturing of each silicon single crystal. Accordingly, even though the capacity of the hopper corresponds to approximately each single crystal grown, a continuous operation of the apparatus for a long period of time can be carried out.

What is claimed is:

1. An apparatus for feeding granular silicon material, comprising:
   a hopper for storing granular silicon material;
   a feeder for feeding granular silicon material stored in said hopper;
   a first guide tube arranged for receiving granular silicon material fed from said feeder, and for leading the received material to an outlet of said first guide tube;
   a feed tube for feeding granular silicon material, and which is arranged at a lower portion of said first guide tube, said feed tube being movable upwardly and downwardly between upper and lower positions, said feed tube surrounding said lower portion of first guide tube when in said upper position;
   a housing incorporating therein the hopper, the feeder, the first guide tube and the feed tube;

a chamber mounted below said housing for receiving granular silicon material from said housing, and including means including a crucible for manufacturing silicon single crystals from said granular silicon material;

a sluice valve for selectively closing an opening of said chamber said feed tube being movable with a stroke between said upper and lower positions such that when it is in said upper position, a lower end of said feed tube is located above said sluice valve when said sluice valve is closed, and when said feed tube is located at said lower position, said lower end thereof is in a position passing through and below said sluice valve when said sluice valve is opened; and a second guide tube which is positioned in communication with at least a portion of said opening of said chamber and which is arranged to receive granular silicon material from said feed tube when said feed tube is in said lower position, said second guide tube leading granular silicon material to said crucible for melting the granular silicon material fed thereto.

2. The apparatus of claim 1, further comprising linkage means coupled to said feed tube for raising and lowering said feed tube between said upper and lower positions thereof.

3. The apparatus of claim 1, further comprising a rebound prevention plate means mounted at an opening portion of said chamber below said sluice valve for preventing material from rebounding from said second guide tube.

4. The apparatus of claim 3, wherein said rebound prevention plate means comprises an opening therein through which said feed tube passes when said feed tube is in said lower position extending through and below said sluice valve.

* * * * *

UNITED STATES PATENT AND TRADEMARK OFFICE
CERTIFICATE OF CORRECTION

PATENT NO. : 5,152,433
DATED : October 6, 1992
INVENTOR(S) : MOHRI, Yoshio

It is certified that error appears in the above-identified patent and that said Letters Patent is hereby corrected as shown below:

Column 2, line 58, following "showing", insert --a--.

Column 3, line 63, change "for and inert" to --for an inert--.

Column 5, line 17, following "time", delete "of".

Column 6, line 46, following "chamber", delete ",".

Signed and Sealed this

Twenty-first Day of December, 1993

Attest:

BRUCE LEHMAN

Attesting Officer    Commissioner of Patents and Trademarks